(12) United States Patent
Kim et al.

(10) Patent No.: US 8,916,859 B2
(45) Date of Patent: Dec. 23, 2014

(54) PIXEL AND ORGANIC LIGHT EMITTING DISPLAY DEVICE HAVING THE SAME

(71) Applicant: Samsung Display Co., Ltd., Yongin, Gyeonggi-Do (KR)

(72) Inventors: Taegon Kim, Cheonan-si (KR); Kyungmin Park, Cheonan-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/781,922

(22) Filed: Mar. 1, 2013

(65) Prior Publication Data
US 2014/0042400 A1 Feb. 13, 2014

(30) Foreign Application Priority Data

Aug. 7, 2012 (KR) .......................... 10-2012-0086447

(51) Int. Cl.
*H01L 51/10* (2006.01)
*H01L 27/32* (2006.01)
*H01L 51/05* (2006.01)

(52) U.S. Cl.
CPC .......... *H01L 51/102* (2013.01); *H01L 27/3246* (2013.01); *H01L 27/3248* (2013.01); *H01L 27/3276* (2013.01); *H01L 51/0545* (2013.01)
USPC .......................................................... 257/40

(58) Field of Classification Search
CPC ............ H01L 27/3246; H01L 27/3276; H01L 51/0545

USPC ........... 257/40, 66; 345/88, 94, 211; 349/122; 365/185.13

See application file for complete search history.

(56) References Cited

U.S. PATENT DOCUMENTS

| | | | |
|---|---|---|---|
| 2007/0064486 A1* | 3/2007 | Sung et al. | 365/185.13 |
| 2007/0187759 A1* | 8/2007 | Lee et al. | 257/347 |
| 2008/0158120 A1* | 7/2008 | An et al. | 345/88 |
| 2009/0309101 A1* | 12/2009 | Kim et al. | 257/59 |

FOREIGN PATENT DOCUMENTS

| | | |
|---|---|---|
| JP | 2010-138026 A | 6/2010 |
| JP | 2010-225403 A | 10/2010 |
| JP | 2011-029322 A | 2/2011 |
| KR | 10-2009-0119701 A | 11/2009 |

\* cited by examiner

*Primary Examiner* — Marcos D. Pizarro
*Assistant Examiner* — Sue Tang
(74) *Attorney, Agent, or Firm* — Robert E. Bushnell, Esq.

(57) ABSTRACT

A pixel of an organic light emitting display device includes a transistor, an organic light emitting diode, and a common line. The organic light emitting diode includes a first common layer, an organic light emitting layer disposed on the first common layer, and a second common layer. The common line is disposed between the first common layer and the second common layer to make electrical contact with the first common layer. The common line is supplied with a reference voltage to prevent the organic light emitting diode from generating light by leakage current in the transistor.

20 Claims, 9 Drawing Sheets

PIXEL AND ORGANIC LIGHT EMITTING DISPLAY DEVICE HAVING THE SAME

CLAIM OF PRIORITY

This application makes reference to, incorporates the same herein, and claims all benefits accruing under 35 U.S.C. §119 from an application earlier filed in the Korean Intellectual Property Office on the 7 Aug. 2012 and there duly assigned Serial No. 10-2012-0086447.

BACKGROUND OF THE INVENTION

1. Field of the Invention

The present disclosure relates to a pixel and an organic light emitting display device having the same. More particularly, the present disclosure relates to a pixel capable of improving image display quality and an organic light emitting display device having the pixel.

2. Description of the Related Art

An organic light emitting display device includes a plurality of pixels each having an organic light emitting diode. The organic light emitting diode includes an organic light emitting layer that emits light and electrodes that apply a driving voltage to the organic light emitting diode. In addition, common layers are disposed between the organic light emitting diode and the electrodes.

Each pixel includes at least one transistor and at least one capacitor. The transistor applies the driving voltage to the organic light emitting diode. The capacitor maintains the driving voltage, which is applied to the organic light emitting diode, during one frame period.

During a turn-on period of the transistor, each pixel emits the light, and each pixel does not emit the light during a turn-off period of the transistor. However, although the transistor is turned off, a leakage current occurs in the turned-off transistor. As a result, some of the pixels emit the light due to the leakage current generated by a corresponding transistor during the turn-off period of the transistor.

SUMMARY OF THE INVENTION

The present disclosure provides a pixel capable of preventing leakage current and improving image display quality.

The present disclosure provides an organic light emitting display device having the pixel.

Embodiments of the inventive concept provide a pixel including an organic light emitting diode disposed in a light emitting area, a transistor disposed in a non-light emitting area adjacent to the light emitting area, and a common line. The transistor controls a driving current flowing through the organic light emitting diode. The common line makes contact with the organic light emitting diode and is applied with a reference voltage to prevent the organic light emitting diode from generating a light by a leakage current in the transistor The organic light emitting diode may include a first electrode connected to the transistor to receive a first voltage, a first common layer disposed on the first electrode, an organic light emitting layer disposed on the first common layer, a second common layer disposed on the organic light emitting layer, and a second electrode disposed on the second common layer to receive a second voltage having a different voltage level from the first voltage. The common line may be disposed between the first common layer and the second common layer and makes contact with the first common layer.

The first common layer may include a hole injection layer. The first common layer may further include a hole transport layer disposed between the hole injection layer and the organic light emitting layer.

The second common layer may include an electron injection layer. The second common layer may further include an electron transport layer disposed between the organic light emitting layer and the electron injection layer.

Embodiments of the inventive concept provide an organic light emitting display device including a base substrate, a plurality of scan lines disposed on the base substrate, a plurality of data lines, a pixel definition layer, and a common line overlapped with the pixel definition layer and applied with a reference voltage.

The scan lines are extended in a first direction and the data lines are arranged in a second direction crossing the first direction. The data lines are insulated from the scan lines and crossing the scan lines. The pixel definition layer is provided with a plurality of openings formed therethrough.

Each of the pixels is connected to a corresponding one of the scan lines and a corresponding one of the data lines and includes an organic light emitting diode disposed in a corresponding one of the openings.

The pixels may include a first pixel and a second pixel adjacent to the first pixel. The first common layer of the first pixel may be integrally formed with the first common layer of the second pixel. A portion of the integrally-formed first common layer may be overlapped with a portion of the pixel definition layer.

The second common layer of the first pixel may be integrally formed with the second common layer of the second pixel. A portion of the integrally-formed second common layer may be overlapped with the portion of the pixel definition layer. The common line may be disposed between the portion of the integrally-formed first common layer and the portion of the integrally-formed second common layer.

According to the above, the pixel includes the transistor disposed in the non-light emitting area, the organic light emitting diode disposed in the light emitting area, and the common line. The common line makes contact with the first common layer of the organic light emitting diode. The common line receives the reference voltage to prevent the organic light emitting diode from generating the light by the leakage current in the transistor. The leakage current is grounded to the common line.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
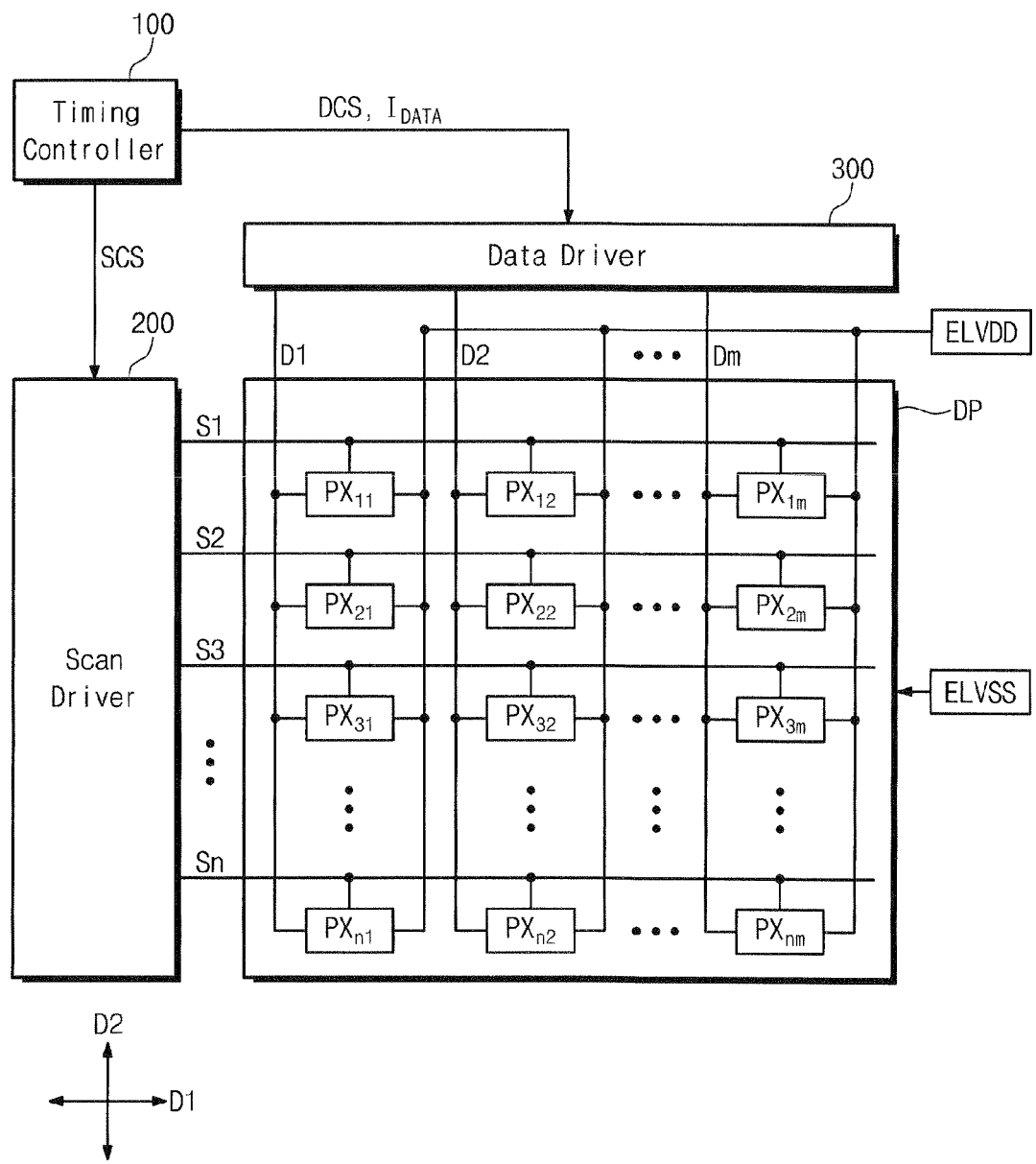
FIG. 1 is a block diagram showing an organic light emitting display device according to an exemplary embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a block diagram showing an organic light emitting display device according to an exemplary embodiment of the present invention.

Referring to FIG. 1, an organic light emitting display device includes a display panel DP, a timing controller 100, a scan driver 200, and a data driver 300.

The display panel DP includes a base substrate 10 (refer to FIG. 3), a plurality of scan lines S1 to Sn disposed on the base substrate 10, a plurality of data lines D1 to Dm disposed on the base substrate 10, and matrix of a plurality of pixels $PX_{11}$ to PXnm each of which is connected to a corresponding one of the scan lines S1 to Sn and a corresponding one of the data lines D1 to Dm.

The scan lines S1 to Sn are extended in a first direction D1 on the base substrate 10 and arranged in a second direction D2 crossing the first direction D1. The data lines D1 to Dm are insulated from the scan lines S1 to Sn and crossing the scan lines S1 to Sn. The data lines D1 to Dm are extended in the second direction D2 and arranged in the first direction D1.

The display panel DP receives a first source voltage ELVDD and a second source voltage ELVSS from a power source (not shown). Each of the pixels $PX_{11}$ to PXnm is turned on in response to a corresponding scan signal. Each of the pixels $PX_{11}$ to PXnm receives the first source voltage ELVDD and the second source voltage ELVSS and generates light in response to a corresponding data signal. The first source voltage ELVDD has a voltage level higher than that of the second source voltage ELVSS.

Each of the pixels $PX_{11}$ to PXnm includes at least one transistor, at least one capacitor, and at least one organic light emitting diode. The transistor applies a voltage corresponding to the first source voltage ELVDD to the organic light emitting diode. The voltage output from the transistor may have a voltage level lower than that of the first source voltage ELVDD.

The transistor controls a driving current flowing through the organic light emitting diode in accordance with an amount of electric charge charged in the capacitor. The organic light emitting diode generates light corresponding to the voltage from the transistor and the second source voltage ELVSS.

The timing controller 100 receives input image signals and converts the input image signals to image data $I_{DATA}$ appropriate to the operation condition of the display panel DP to output the image data $I_{DATA}$ and various control signals SCS and DCS.

The scan driver 200 receives a scan driving control signal SCS from the timing controller 100. The scan driver 200 generates a plurality of scan signals in response to the scan driving control signal SCS. The scan driver 200 sequentially applies the scan signals to the scan lines S1 to Sn.

The data driver 300 receives a data driving control signal DCS and the image data $I_{DATA}$ from the timing controller 100. The data driver 300 generates a plurality of data signals on the basis of the data driving control signal DCS and the image data $I_{DATA}$. The data signals are applied to the data lines D1 to Dm.

Figure 2:
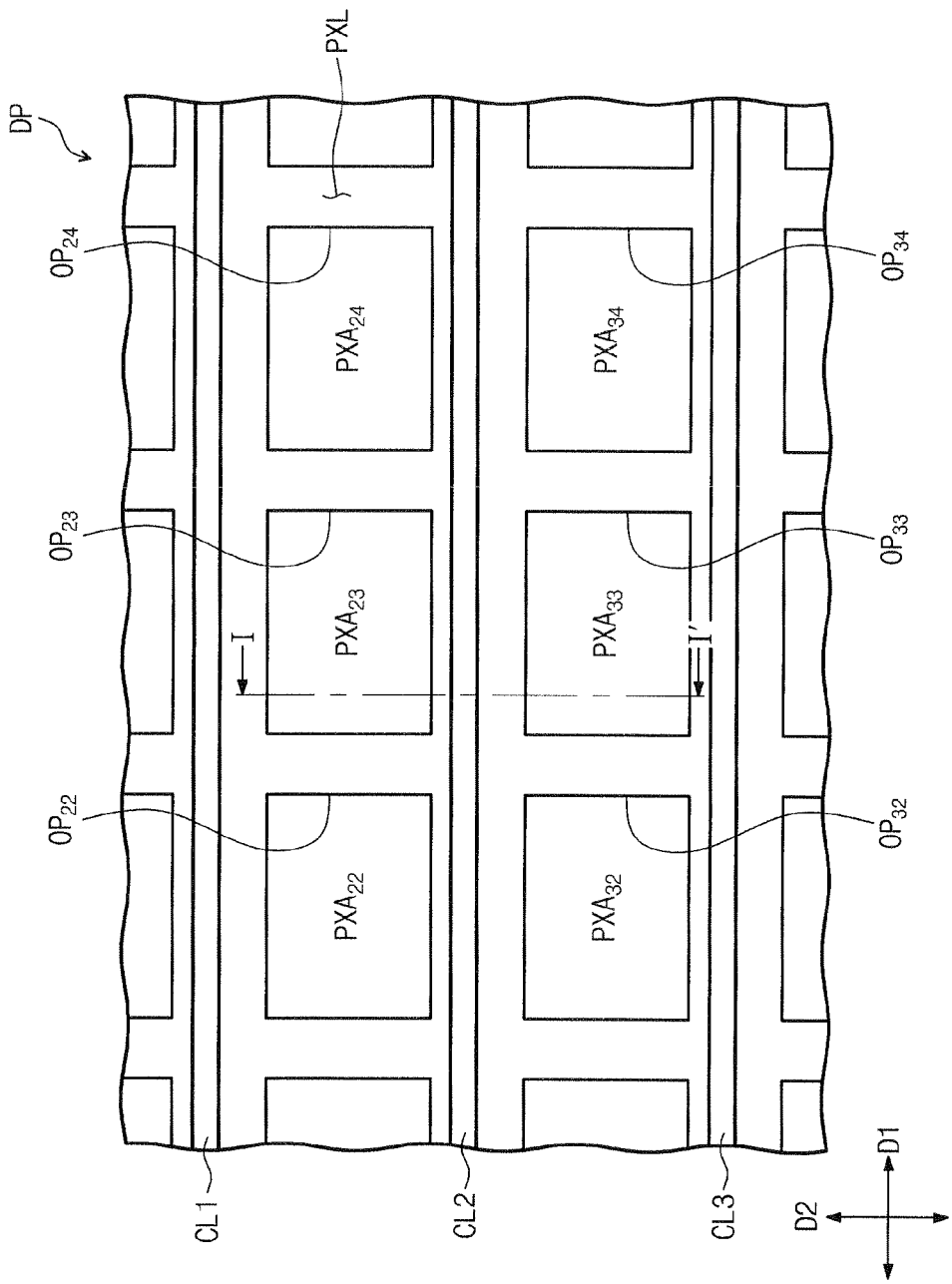
FIG. 2 is an enlarged plan view showing a display panel according to an exemplary embodiment of the present invention.
Figure 3:
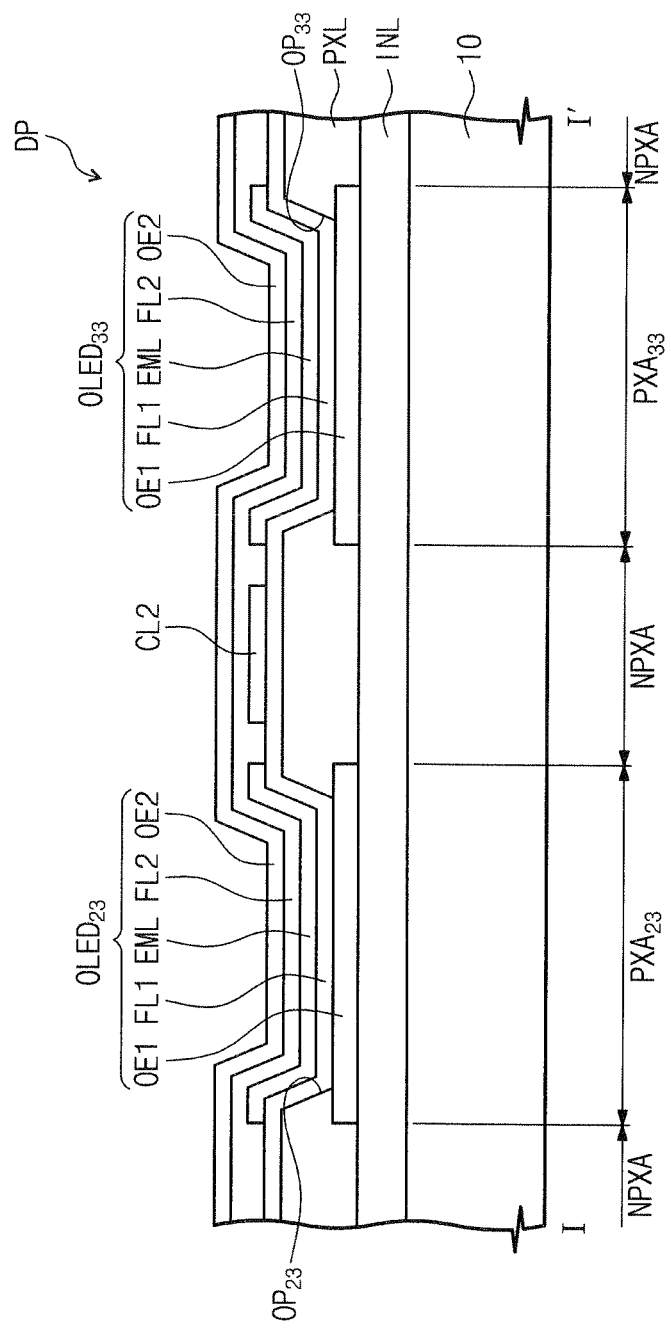
FIG. 3 is a cross-sectional view taken along a line I-I' of FIG. 2.

FIG. 2 is an enlarged plan view showing a display panel according to an exemplary embodiment of the present invention and FIG. 3 is a cross-sectional view taken along a line I-I' of FIG. 2.

FIG. 2 shows six openings $OP_{22}$ to $OP_{34}$ among plural openings and six light emitting areas $PXA_{22}$ to $PXA_{34}$. In addition, FIG. 2 shows three common lines CL1 to CL3, and FIG. 3 shows two light emitting areas $PXA_{23}$ and $PXA_{33}$ adjacent to each other in a cross section.

The display panel DP includes a pixel definition layer PXL provided with the openings $OP_{22}$ to $OP_{34}$. The openings $OP_{22}$ to $OP_{34}$ define the light emitting areas $PXA_{22}$ to $PXA_{34}$. The light emitting areas $PXA_{22}$ to $PXA_{34}$ are arranged in a matrix form. As shown in FIG. 3, organic light emitting diodes $OLED_{23}$ and $OLED_{33}$ of the pixels are disposed in the light emitting areas $PXA_{23}$ and $PXA_{33}$, respectively.

In the present exemplary embodiment, an area in which the pixel definition layer PXL is disposed is referred to as a non-light emitting area NPXA. The light emitting areas $PXA_{23}$ and $PXA_{33}$ are surrounded by the non-light emitting area NPXA.

The display panel DP includes the common lines CL1 to CL3 overlapping the pixel definition layer PXL. The common lines CL1 to CL3 are applied with a reference voltage. The reference voltage has the same voltage level as that of the second source voltage ELVSS.

The common lines CL1 to CL3 are extended in the first direction D1. The common lines CL1 to CL3 are substantially in parallel to the scan lines S1 to Sn. The common lines CL1 to CL3 are arranged in the second direction D2 to be spaced apart from each other.

A first pixel and a second pixel, which are arranged in the second direction D2, are respectively disposed in the light emitting areas $PXA_{23}$ and $PXA_{33}$. The first pixel includes a first organic light emitting diode $OLED_{23}$ and the second pixel includes a second organic light emitting diode $OLED_{33}$.

Referring to FIG. 3, at least one insulating layer INL is disposed on a surface of the base substrate 10. Although not shown in detail, the insulating layer INL includes a plurality of thin layers of an inorganic thin layer and/or an organic thin layer.

The first and second organic light emitting diodes $OLED_{23}$ and $OLED_{33}$ are disposed on the insulating layer INL. Each of the first and second organic light emitting diodes $OLED_{23}$ and $OLED_{33}$ includes a first electrode OE1, a first common layer FL1, an organic light emitting layer EML, a second common layer FL2, and a second electrode OE2. In the present exemplary embodiment, the first electrode OE1 and the second electrode OE2 will be described as a positive electrode and a negative electrode, respectively.

The first electrode OE1 of each of the first and second organic light emitting diodes $OLED_{23}$ and $OLED_{33}$ is disposed on the insulating layer INL. The pixel definition layer PXL is disposed on the insulating layer INL. The first electrode OE1 is partially exposed through the openings $OP_{23}$ and $OP_{33}$ defined by the pixel definition layer PXL.

The first common layer FL1 is disposed on the first electrode OE1 and the pixel definition layer PXL. As shown in FIG. 3, the first common layer FL1 of the first organic light emitting diode $OLED_{23}$ may be integrally formed with the first common layer FL1 of the second organic light emitting diode $OLED_{33}$.

The first common layer FL1 includes a hole injection layer (not shown). The hole injection layer makes contact with the first electrode OE1. In addition, the first common layer FL1 further includes a hole transport layer (not shown) disposed on the hole injection layer.

A portion of the integrally-formed first common layer FL1 overlaps a portion of the pixel definition layer PXL in the non-light emitting area NPXA. Among the common lines CL1, CL2, and CL3, the common line CL2 is disposed on a portion of the first common layer FL1 in the non-light emitting area NPXA between light emitting areas $PXA_{23}$ and $PXA_{33}$.

The overlap between the portion of the first common layer FL1 and the common line CL2 may be changed. According to the present exemplary embodiment, it is enough that the portion of the first common layer FL1 is electrically connected to the corresponding common line, e.g., the common line CL2. Different from FIG. 3, the common line CL2 may be disposed under the first common layer FL1. In this case, the common line CL2 makes contact with a portion of the pixel definition layer PXL and a portion of the first common layer FL1 covers the common line CL2.

The organic light emitting layer EML of each of the first and second organic light emitting diodes $OLED_{23}$ and $OLED_{33}$ is disposed on the first common layer FL1. The organic light emitting layer EML of the first organic light emitting diode $OLED_{23}$ overlaps the first electrode OE1 of the first organic light emitting diodes $OLED_{23}$ and the organic light emitting layer EML of the second organic light emitting diode $OLED_{33}$ overlaps the first electrode OE1 of the second organic light emitting diode $OLED_{33}$.

The second common layer FL2 of each of the first and second organic light emitting diodes $OLED_{23}$ and $OLED_{33}$ is disposed on the integrally-formed first common layer FL1. As shown in FIG. 3, the second common layer FL2 of the first organic light emitting diode $OLED_{23}$ may be integrally formed with the second common layer FL2 of the second organic light emitting diode $OLED_{33}$.

The integrally-formed second common layer FL2 covers the organic light emitting layer EML of each of the first and second organic light emitting diodes $OLED_{23}$ and $OLED_{33}$ and the common line CL2.

The second common layer FL2 includes an electron injection layer. In addition, the second common layer FL2 further includes an electron transport layer disposed between the organic light emitting layer EML and the electron injection layer.

The second electrode OE2 of each of the first and second organic light emitting diodes $OLED_{23}$ and $OLED_{33}$ is disposed on the integrally-formed second common layer FL2. The second electrode OE2 receives the second source voltage ELVSS. As shown in FIG. 3, the second electrode OE2 of the first organic light emitting diode $OLED_{23}$ may be integrally formed with the second electrode OE2 of the second organic light emitting diode $OLED_{33}$.

Although not shown in FIGS. 2 and 3, the first common layers, the second common layers, and the second electrodes of the organic light emitting diodes included in the pixels $PX_{11}$ to PXnm each are integrally formed.

In addition, a protective layer and/or a color filter layer may be disposed on the integrally-formed second common layer FL2. The display panel DP may include additional base substrate facing the base substrate 10. The additional base substrate may be a sealing substrate to protect the pixels $PX_{11}$ to PXnm.

Figure 4:
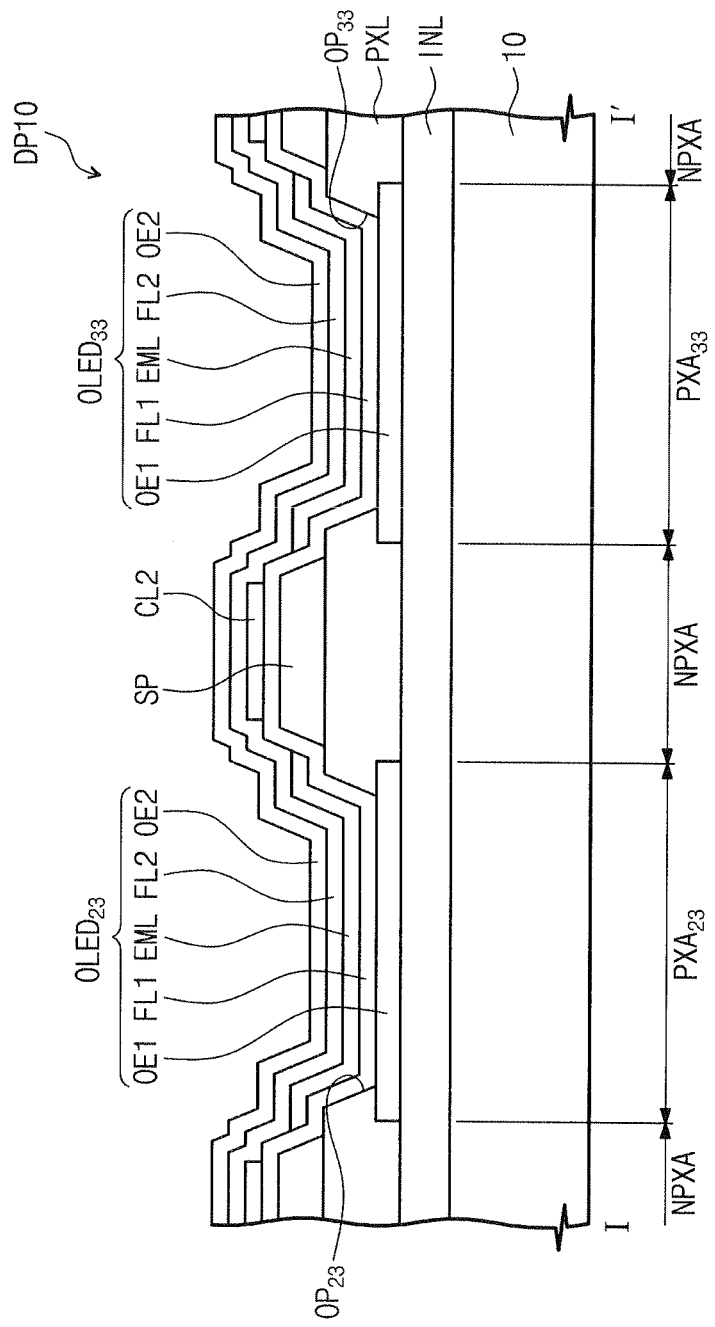
FIG. 4 is a cross-sectional view taken along a line I-I' of FIG. 2 according to another exemplary embodiment of the present invention.

FIG. 4 is a cross-sectional view taken along a line I-I' of FIG. 2 according to another exemplary embodiment of the present invention.

Referring to FIG. 4, a display panel DP10 further includes a spacer SP overlapping a portion of the pixel definition layer PXL. The spacer SP is disposed above the base substrate 10 and has a similar shape to that of the pixel definition layer PXL.

The spacer SP is disposed on the pixel definition layer PXL. Accordingly, the integrally-formed first common layer FL1 covers the spacer SP.

Figure 5:
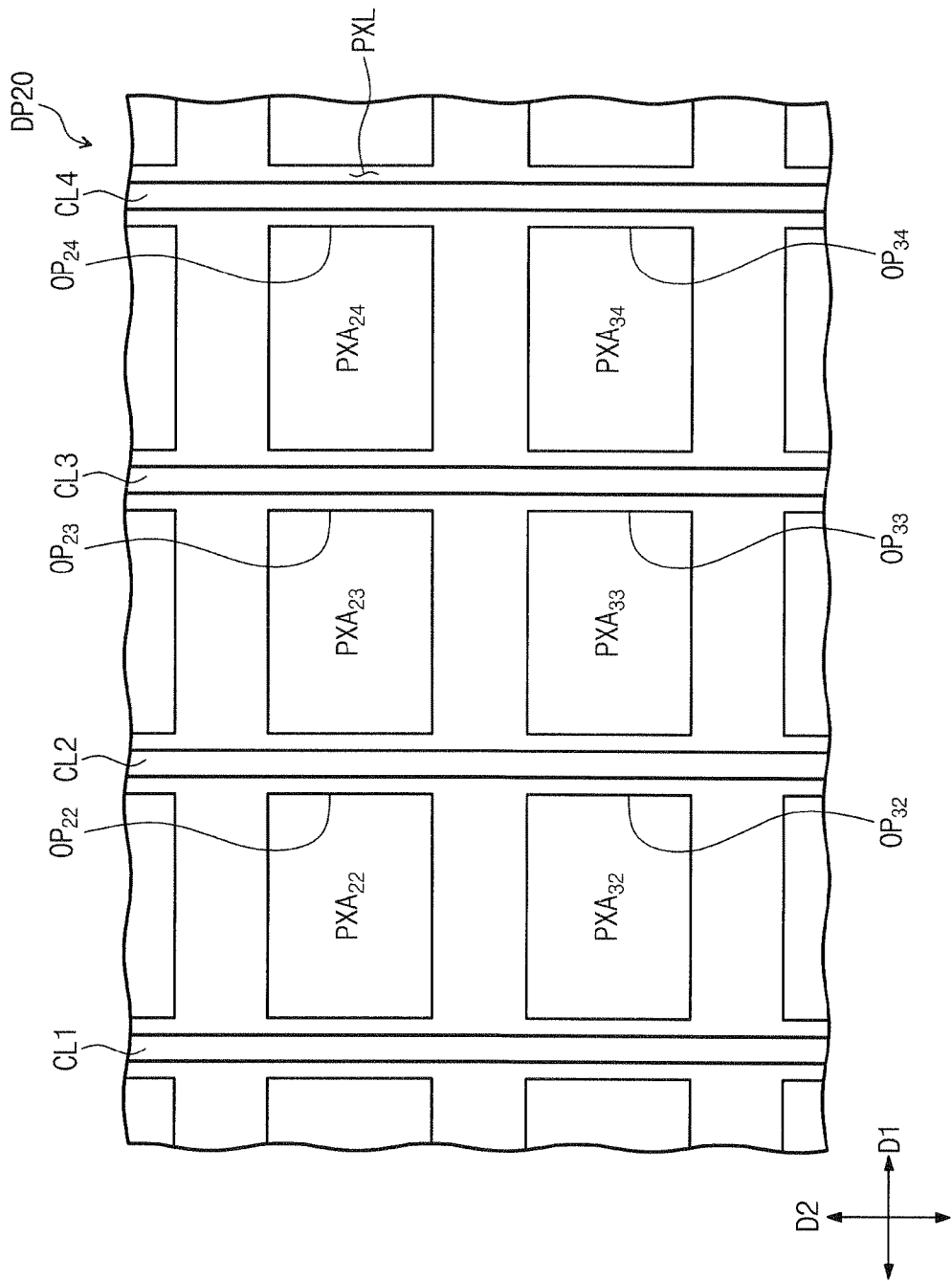
FIG. 5 is an enlarged plan view showing a display panel according to another exemplary embodiment of the present invention.

FIG. 5 is an enlarged plan view showing a display panel according to another exemplary embodiment of the present invention. FIG. 5 shows six openings $OP_{22}$ to $OP_{34}$ among plural openings and six light emitting areas $PXA_{22}$ to $PXA_{34}$. In addition, FIG. 5 shows four common lines CL1 to CL4.

Referring to FIG. 5, the common lines CL1 to CL4 included in the display panel DP20 are extended in the second direction D2. The common lines CL1 to CL4 are substantially in parallel to the data lines D1 to Dm. The common lines CL1 to CL4 are arranged in the first direction D1 to be spaced apart from each other.

According to yet another exemplary embodiment, not shown, each of the common lines CL1 to CL4 may have a portion extended in the first direction D1 and a portion extended in the second direction D2. In addition, two common lines adjacent to each other among the common lines CL1 to CL4 may be connected to each other by a wiring extended in the first direction D1.

Figure 6:
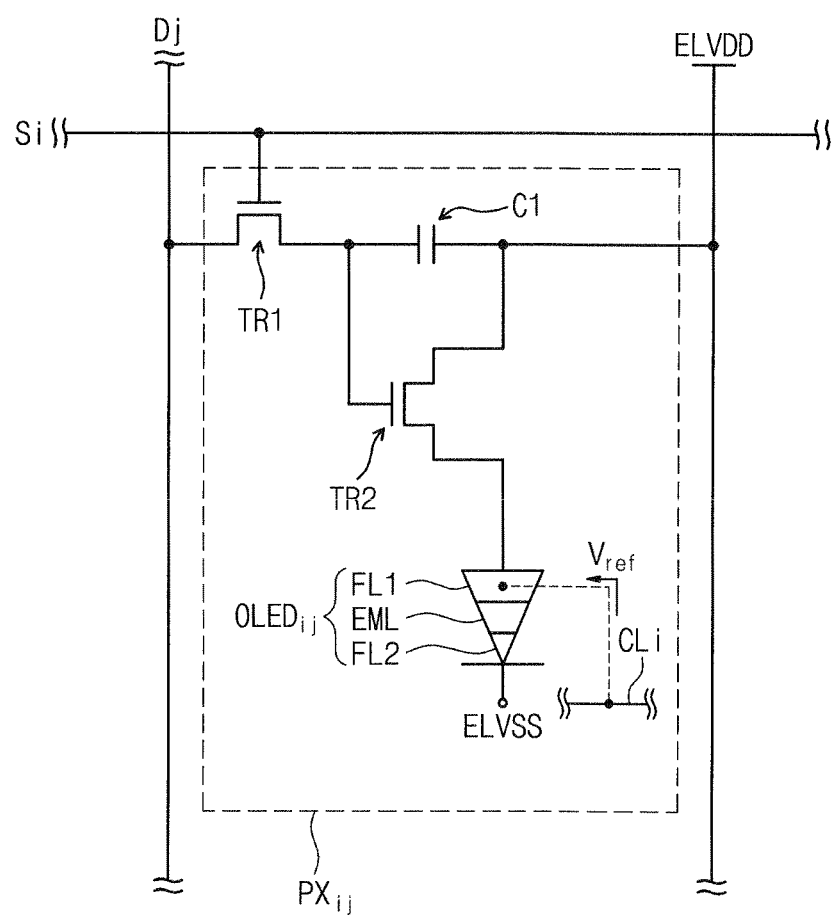
FIG. 6 is an equivalent circuit diagram of a pixel according to an exemplary embodiment of the present invention.

FIG. 6 is an equivalent circuit diagram of a pixel according to an exemplary embodiment of the present invention. FIG. 6 shows the equivalent circuit diagram of a pixel PXij connected to an i-th scan line Si and a j-th data line Dj as an example.

The pixel PXij includes a first transistor TR1, a second transistor TR2, a capacitor C1, and an organic light emitting diode OLEDij.

The first transistor TR1 includes a control electrode connected to the i-th scan line Si, an input electrode connected to the j-th data line Dj, and an output electrode. The first transistor TR1 outputs the data signal applied to the j-th data line Dj in response to the scan signal applied to the i-th scan line Si.

The capacitor C1 includes a first electrode connected to the first transistor TR1 and a second electrode applied with the first source voltage ELVDD. The capacitor C1 is charged with an electric charge corresponding to a difference voltage between a voltage corresponding to the data signal from the first transistor TR1 and the first source voltage ELVDD.

The second transistor TR2 includes a control electrode connected to the output electrode of the first transistor TR1 and the first electrode of the capacitor C1, an input electrode applied with the first source voltage ELVDD, and an output electrode. The output electrode of the second transistor TR2 is connected to the organic light emitting diode OLEDij.

The second transistor TR2 controls the driving current flowing through the organic light emitting diode OLEDij in accordance with the amount of the electric charge charged in the capacitor C1. A turn-on time of the second transistor TR2 is determined according to the amount of the electric charge charged in the capacitor C1. The output electrode of the second transistor TR2 applies the voltage having a voltage level lower than that of the first source voltage ELVDD to the organic light emitting diode OLEDij.

The organic light emitting diode OLEDij includes a first electrode (not shown) connected to the output electrode of the second transistor TR2 and a second electrode (not shown) applied with the second source voltage ELVSS. The organic light emitting diode OLEDij further includes a first common layer FL1, an organic light emitting layer EML, and a second common layer FL2, which are disposed between the first electrode and the second electrode. The organic light emitting diode OLEDij emits the light during the turn-on period of the second transistor TR2 and does not emit the light during the turn-off period of the second transistor TR2.

During the turn-off period of the second transistor TR2, a leakage current occurs in the second transistor TR2. When the leakage current of the second transistor TR2 is applied to the organic light emitting diode OLEDij, the organic light emitting diode OLEDij generates the light corresponding to the leakage current.

For the convenience of explanation, the organic light emitting diode OLED shown in FIG. 6 has been described that the organic light emitting diode OLEDij emits the light by the leakage current of the second transistor TR2 in one pixel PXij, but the leakage current may be transmitted to the pixels adjacent to the pixel PXij along the integrally-formed first common layer FL1.

For instance, in FIG. 2, the leakage current that causes the light emission in one of the light emitting area $PXA_{23}$ of the light emitting areas $PXA_{22}$ to $PXA_{34}$ may not be the leakage current generated by the transistor corresponding to the one light emitting area $PXA_{23}$. That is, the light emission may occur in the one light emitting area $PXA_{23}$ by the leakage current generated in the transistors respectively corresponding to the light emitting areas $PXA_{22}$, $PXA_{24}$, $PXA_{32}$, $PXA_{33}$, and $PXA_{34}$ that are adjacent to the one light emitting area $PXA_{23}$.

In FIG. 6, a reference voltage Vref is applied to the organic light emitting diode OLEDij to prevent the light from being generated by the leakage current. The reference voltage Vref is applied to the first common layer FL1 of the organic light emitting diode OLEDij through the corresponding common line CLi. Thus, the leakage current is grounded without being transmitted to the organic light emitting layer EML of the organic light emitting diode OLEDij.

Figure 7:
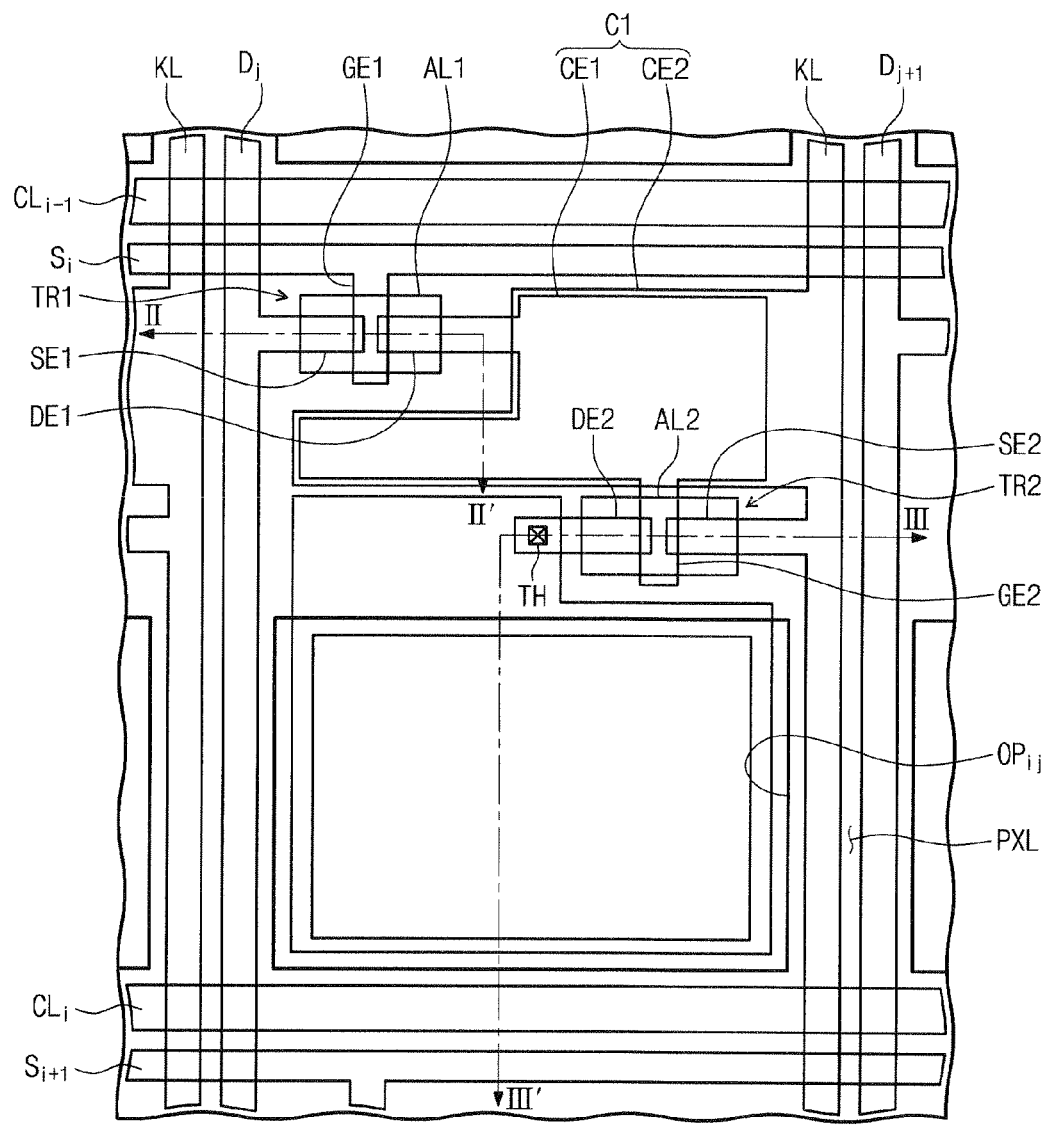
FIG. 7 is a plan view showing a layout of a pixel according to an exemplary embodiment of the present invention.
Figure 8A:
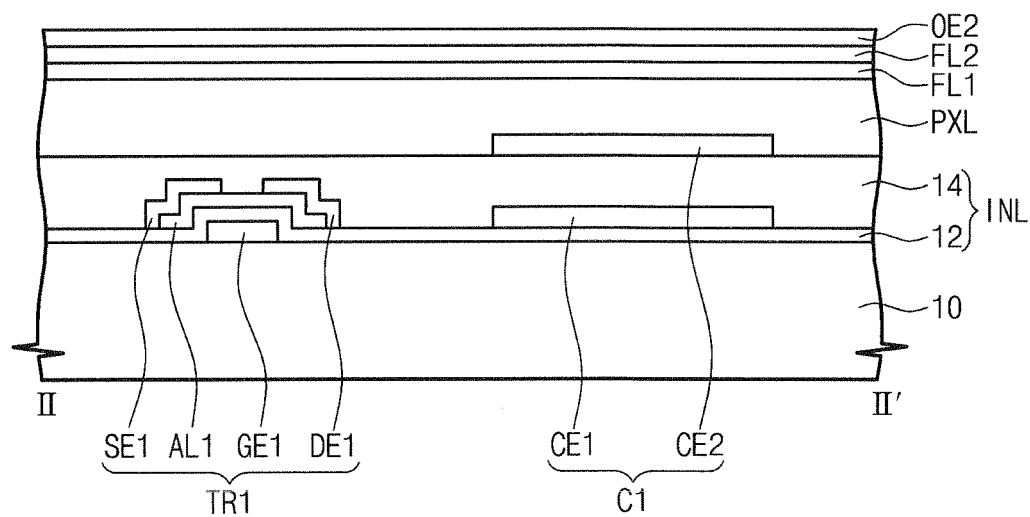
FIG. 8A is a cross-sectional view taken along a line II-IF of FIG. 7.
Figure 8B:
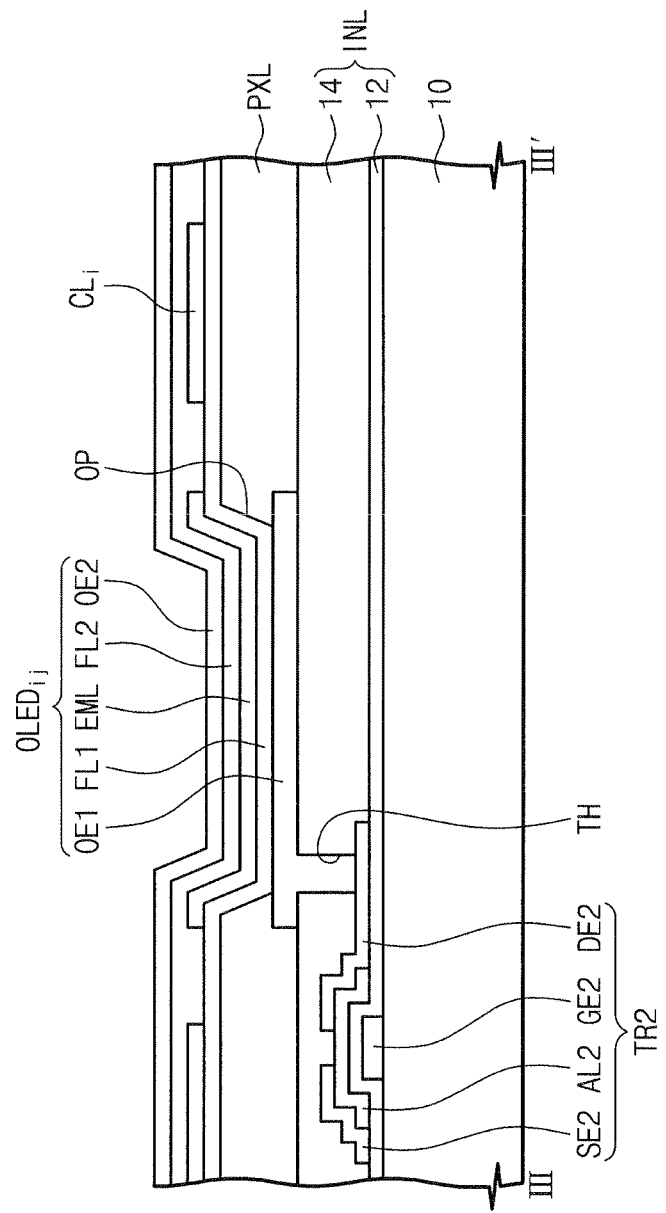
FIG. 8B is a cross-sectional view taken along a line III-III' of FIG. 7.

FIG. 7 is a plan view showing a layout of a pixel according to an exemplary embodiment of the present invention, FIG. 8A is a cross-sectional view taken along a line II-IF of FIG. 7, and FIG. 8B is a cross-sectional view taken along a line III-III' of FIG. 7.

Referring to FIGS. 7, 8A, and 8B, the i-th scan line Si and the j-th data line Dj are disposed on the base substrate 10 to be insulated from each other and crossing each other. In addition, a source voltage line KL applied with the first source voltage ELVDD and a common line CLi applied with the reference voltage Vref are disposed on the base substrate 10.

The control electrode GE1 (hereinafter, referred to as first control electrode) of the first transistor TR1 is branched from the i-th scan line Si. A first insulating thin layer 12 is disposed on the base substrate 10 to cover the i-th scan line Si. The first insulating thin layer 12 includes an organic layer and/or an inorganic layer.

A semiconductor layer AL1 (hereinafter, referred to as first semiconductor layer) of the first transistor TR1 is disposed on the first control electrode GE1 and interposing the first insulating thin layer 12 therebetween. The input electrode SE1 (hereinafter, referred to as first input electrode) and the output electrode DE1 (hereinafter, referred to as first output electrode) of the first transistor TR1 are disposed to overlap with the first semiconductor layer AL1. The first input electrode SE1 and the first output electrode DE1 are disposed to be spaced apart from each other.

The first electrode CE1 of the capacitor C1 is disposed on the first insulating thin layer 12. The first electrode CE1 of the capacitor C1 is connected to the first output electrode DE1.

A second insulating thin layer 14 is disposed on the first insulating layer 12 to cover the first input electrode SE1, the first output electrode DE1, and the first electrode CE1 of the capacitor C1.

The second electrode CE2 of the capacitor C1 is disposed on the second insulating thin layer 14, and the second electrode CE2 is connected to the source voltage line KL.

The control electrode GE2 (hereinafter, referred to as second control electrode) of the second transistor TR2 is connected to the first electrode CE1 of the capacitor C1. A semiconductor layer AL2 (hereinafter, referred to as second semiconductor layer) of the second transistor TR2 is disposed on the second control electrode GE2 and interposing the first insulating thin layer 12 therebetween. The input electrode SE2 (hereinafter, referred to as second input electrode) and the output electrode DE2 (hereinafter, referred to as second output electrode) of the second transistor TR2 are disposed to overlap with the second semiconductor layer AL2. The second input electrode SE2 and the second output electrode DE2 are disposed to be spaced apart from each other. The second insulating thin layer 14 covers the second input electrode SE2 and the second output electrode DE2.

The organic light emitting diode OLEDij is disposed on the second insulating thin layer 14. In detail, the first electrode OE1 of the organic light emitting diode OLEDij is disposed on the second insulating thin layer 14, the first common layer FL1 is disposed on the first electrode OE1, the organic light emitting layer EML is disposed on the first common layer FL1, the second common layer FL2 is disposed on the organic light emitting layer EML, and a second electrode OE2 of the organic light emitting diode OLEDij is disposed on the second common layer FL2. The first electrode OE1 is connected to the second output electrode DE2 through a contact hole TH formed through the second insulating thin layer 14.

The pixel definition layer PXL is disposed on the second insulating thin layer 14. The pixel definition layer PXL covers the second electrode CE2 of the capacitor C1 (FIG. 8A). The pixel definition layer PXL is provided with an opening OP (FIG. 8B) formed therethrough to expose the first electrode OE1 of the organic light emitting diode OLEDij. A side surface of the pixel definition layer PXL, which defines the opening OP, may be inclined with respect to the first electrode OE1.

The first common layer FL1 is disposed on the pixel definition layer PXL. The first common layer FL1 makes contact with the first electrode OE1 through the opening OP. The first common layer FL1 is disposed on the side surface defining the opening OP and on the first electrode OE1.

The organic light emitting layer EML is disposed on the first common layer FL1 to correspond to the opening OP. The second common layer FL2 is disposed on the first common layer FL1. The second common layer FL2 covers the organic light emitting layer EML. The second electrode OE2 is disposed on the second common layer FL2.

The common line CLi is disposed on the first common layer FL1. The common line CLi makes contact with a portion of the first common layer FL1 in the area in which the common line CLi overlaps the pixel definition layer PXL.

The leakage current generated during the turn-off period of the second transistor TR2 is grounded to the common line CLi through the first common layer FL1. Accordingly, the organic light emitting diode OLEDij does not emit the light during the turn-off period of the second transistor TR2 since the leakage current is grounded to the common line CLi.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. A pixel comprising:
an organic light emitting diode disposed in a light emitting area;
a transistor disposed in a non-light emitting area adjacent to the light emitting area to control a driving current flowing through the organic light emitting diode; and
a common line disposed in the non-light emitting area and applied with a reference voltage to prevent the organic light emitting diode from generating a light by a leakage current in the transistor, the organic light emitting diode comprising:
a first electrode connected to the transistor to receive a first voltage;
a first common layer disposed on the first electrode;
an organic light emitting layer disposed on the first common layer;
a second common layer disposed on the organic light emitting layer; and
a second electrode disposed on the second common layer to receive a second voltage having a different voltage level from the first voltage, the common line being disposed between the first common layer and the second common layer and making electrical contact with the first common layer.

2. The pixel of claim 1, the first common layer comprising a hole injection layer.

3. The pixel of claim 2, the first common layer further comprising a hole transport layer disposed between the hole injection layer and the organic light emitting layer.

4. The pixel of claim 2, the second common layer comprising an electron injection layer.

5. The pixel of claim 4, the second common layer further comprising an electron transport layer disposed between the organic light emitting layer and the electron injection layer.

6. The pixel of claim 1, the reference voltage having a voltage level equal to a voltage level of the second voltage.

7. An organic light emitting display device comprising:
a base substrate;
a plurality of scan lines disposed on the base substrate, extended in a first direction, and arranged in a second direction crossing the first direction;
a plurality of data lines insulated from the scan lines and crossing the scan lines, extended in the second direction, and arranged in the first direction;
a pixel definition layer disposed on the base substrate and provided with a plurality of openings formed therethrough;
a plurality of pixels, each of which is connected to a corresponding one of the scan lines and a corresponding one of the data lines and includes an organic light emitting diode disposed in a corresponding one of the openings; and
a common line overlapping a portion of the pixel definition layer and supplied with a reference voltage, the plurality of pixels comprising a first pixel and a second pixel adjacent to the first pixel, the organic light emitting diode of each of the first pixel and the second pixel comprising:
a first electrode applied with a first voltage;
a first common layer disposed on the first electrode;
an organic light emitting layer disposed on the first common layer;
a second common layer disposed on the organic light emitting layer; and
a second electrode spaced apart from the common line and disposed on the second common layer to receive a second voltage having a different voltage level from the first voltage, and the common line is electrically connected to the first common layer to prevent the organic light emitting diode from generating a light by a leakage current generated in at least one of the first pixel or the second pixel;

the first common layer of the first pixel being integrally formed with the first common layer of the second pixel.

8. The organic light emitting display device of claim 7, a portion of the integrally-formed first common layer overlaps overlapping a portion of the pixel definition layer.

9. The organic light emitting display device of claim 8, the second common layer of the first pixel being integrally formed with the second common layer of the second pixel.

10. The organic light emitting display device of claim 9, a portion of the integrally-formed second common layer overlapping the portion of the pixel definition layer.

11. The organic light emitting display device of claim 10, the common line being disposed between a portion of the integrally-formed first common layer and a portion of the integrally-formed second common layer.

12. The organic light emitting display device of claim 7, the first pixel and the second pixel being arranged in the first direction and the common line being extended in the first direction.

13. The organic light emitting display device of claim 7, the first common layer comprising a hole injection layer.

14. The organic light emitting display device of claim 13, the first common layer further comprising a hole transport layer disposed between the hole injection layer and the organic light emitting layer.

15. The organic light emitting display device of claim 13, the second common layer comprising an electron injection layer.

16. The organic light emitting display device of claim 15, the second common layer further comprising an electron transport layer disposed between the organic light emitting layer and the electron injection layer.

17. The organic light emitting display device of claim 7, each of the plurality of pixels comprising:
- a first transistor connected to the corresponding scan line and the corresponding data line;
- a capacitor connected to the first transistor; and
- a second transistor connected to the capacitor and the organic light emitting diode to control a driving current flowing through the organic light emitting diode in accordance with an amount of electric charge charged in the capacitor.

18. The organic light emitting display device of claim 7, the common line being spaced-apart from the pixel definition layer.

19. The organic light emitting display device of claim 7, the second common layer being interposed between the common line and the second electrode.

20. The organic light emitting display device of claim 7, the common line being arranged in between adjoining ones of the pixels and without being positioned in any of the pixels.

* * * * *